United States Patent
Pan et al.

(10) Patent No.: US 9,230,953 B2
(45) Date of Patent: Jan. 5, 2016

(54) ESD PROTECTION DEVICE

(71) Applicant: NXP B.V., Eindhoven (NL)

(72) Inventors: Zhihao Pan, Hamburg (DE); Steffen Holland, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/516,978

(22) Filed: Oct. 17, 2014

(65) Prior Publication Data

US 2015/0108536 A1    Apr. 23, 2015

(30) Foreign Application Priority Data

Oct. 21, 2013    (EP) .................................. 13189593

(51) Int. Cl.
    H01L 27/02    (2006.01)
    H01L 29/66    (2006.01)
    H01L 29/74    (2006.01)
    H01L 29/87    (2006.01)
    H01L 29/06    (2006.01)
    H01L 29/732   (2006.01)

(52) U.S. Cl.
    CPC ........ *H01L 27/0262* (2013.01); *H01L 29/0615* (2013.01); *H01L 29/66371* (2013.01); *H01L 29/732* (2013.01); *H01L 29/7404* (2013.01); *H01L 29/7412* (2013.01); *H01L 29/87* (2013.01); *H01L 2224/48091* (2013.01); *H01L 2224/48464* (2013.01); *H01L 2224/73265* (2013.01); *H01L 2924/13091* (2013.01)

(58) Field of Classification Search
    CPC .................................................. H01L 29/66371
    See application file for complete search history.

(56) References Cited

U.S. PATENT DOCUMENTS

| 5,841,197 | A  | * | 11/1998 | Adamic, Jr. ................... | 257/777 |
| 5,861,639 | A  |   | 1/1999  | Bernier |  |
| 6,870,202 | B2 |   | 3/2005  | Oka |  |
| 7,582,917 | B2 | * | 9/2009  | Sheu ............................ | 257/113 |
| 2007/0279824 | A1 | * | 12/2007 | Mallikararjunaswamy .. | 361/118 |
| 2010/0034041 | A1 | * | 2/2010  | Widjaja ........................ | 365/222 |
| 2013/0323917 | A1 | * | 12/2013 | Li et al. ........................ | 438/527 |
| 2014/0167101 | A1 | * | 6/2014  | Bobde et al. .................. | 257/112 |

FOREIGN PATENT DOCUMENTS

EP    0 011 443 A1    5/1980

OTHER PUBLICATIONS

"International Standard IEC 61000-4-2"—Edition 2.0; 66 pages (Dec. 2008).
Extended European Search Report for Application 13189593.0 (Mar. 25, 2014).

* cited by examiner

*Primary Examiner* — Daniel Luke

(57) ABSTRACT

A semiconductor ESD protection device comprising a vertical arrangement of alternating conductivity type layers, wherein the layers are arranged as silicon controlled rectifier and wherein the silicon controlled rectifier is arranged as vertical device and having top and bottom opposing contacts.

16 Claims, 12 Drawing Sheets

ESD PROTECTION DEVICE

CROSS-REFERENCE TO RELATED APPLICATIONS

This application claims the priority under 35 U.S.C. §119 of European patent application no. 13189593.0, filed on Oct. 21, 2013, the contents of which are incorporated by reference herein.

FIELD

The present invention relates to an ESD protection device. In particular it relates to high data rate interconnection comprising such a protection device.

BACKGROUND

Electrical surges such as electrical overstress or electrostatic discharge (ESD) transient pulses are common causes of damage to electronic devices. To protect against such transient surges electronic devices are conventionally protected by surge or ESD protection devices. One type of protection device is the so called Transient voltage suppression (TVS) device.

TVS devices provide protection against electrical overstress or electrostatic discharges and are commonly used in portable/consumer electronic devices such as personal computers, audio and video equipment or mobile telephones. According to the International Electrotechnical Commission standard IEC 61000-4-2 such devices should be protected against system level ESD stresses.

Where protection is required at a system level, for example in a portable electronic device such as a smart phone or tablet computer ESD protection, devices must be adequately protected in accordance with the IEC standards whilst not hampering normal operation of the device. In applications with high speed interfaces such as Universal Serial Bus (USB) and High Definition Multimedia Interface (HDMI) it is necessary that ESD devices have low device capacitance so that signal integrity is maintained. Such ESD devices also require a low clamping voltage in order to protect internal circuitry.

The requirement of low clamping voltage is related to the gate oxide thickness utilised in integrated circuits and devices used in electronic applications. The gate oxide is the dielectric layer that separates the gate terminal of a MOSFET from the underlying source and drain terminals as well as the conductive channel that connects source and drain when the transistor is turned on. Gate oxide is formed by oxidizing the silicon of the channel to form a thin (5-200 nm) insulating layer of silicon dioxide.

A conductive gate material is subsequently deposited over the gate oxide to form the transistor. As device and integrated circuit miniaturization continues the gate oxide thickness must be reduced accordingly. This reduction of gate oxide thickness can reduce the breakdown voltage of the device or IC.

By having a low clamping voltage it is possible to ensure that the gate oxide breakdown voltage is not exceeded. That is, it is possible to set the clamping voltage at an appropriate level to ensure that it does not exceed the gate oxide breakdown voltage. Typically the clamping voltage is set such that it is equal to the maximum voltage drop across the protection device during an ESD or overstress event.

The requirement of low capacitance is related to the high data transfer rates. If the capacitance of the ESD protection device connected to the high data transfer lines is too high the signal may be distorted and data transfer may be reduced or prevented.

Commonly, diodes such as zener diodes are used to provide surge or overstress protection. Whilst such diodes are easy to manufacture and provide a cost effective protection against surge or overstress they have a high capacitance typically in the range of one to several hundred Pico-farads. Due their high capacitance zener diodes are therefore unsuitable to high data rate applications.

So-called silicon controlled rectifiers (SCR) may also be used for on-chip protection however they are not used as discrete protection. Typically the ESD robustness is very different depending on the required application. Normally an internal (or on-chip) ESD protection only protects against overstress events during manufacturing. Discrete protection on the other hand protects devices during operation of a system, such as a HDMI or USB data transfer line. Furthermore SCRs used for surge protection in on-chip or integrated circuit (IC) applications are lateral devices of the type shown in FIG. 1, with contacts solely on the top of the device. Such arrangements are therefore not suitable for standard discrete packages such as SOD882 for example. Specifically, standard discrete packages are generally miniaturised and a lateral device with two top terminal contacts may be very difficult to assemble for a comparable miniaturised form factor.

It is an object of the present invention to provide an ESD protection device which solves or mitigates some or all of the above mentioned problems.

SUMMARY

The invention is set out in the claims.

A semiconductor ESD protection device comprises a vertical arrangement of alternating conductivity type layers, wherein the layers are arranged as silicon controlled rectifier and wherein the silicon controlled rectifier is arranged as vertical device and having top and bottom opposing contacts.

The ESD protection device therefore has vertical current flow between the opposing top and bottom contacts thereby making it compatible with the existing standard discrete packages.

In addition the ESD protection device achieves very high ESD robustness with a low capacitance. For example the ESD robustness may be 15 kV with a capacitance of 0.3-0.4 picofarads.

DESCRIPTION OF THE DRAWINGS

The invention is described further hereinafter by way of example only with reference to the accompanying drawings in which.

In the figures and the following description like reference numerals refer to like features.

Figure 1:
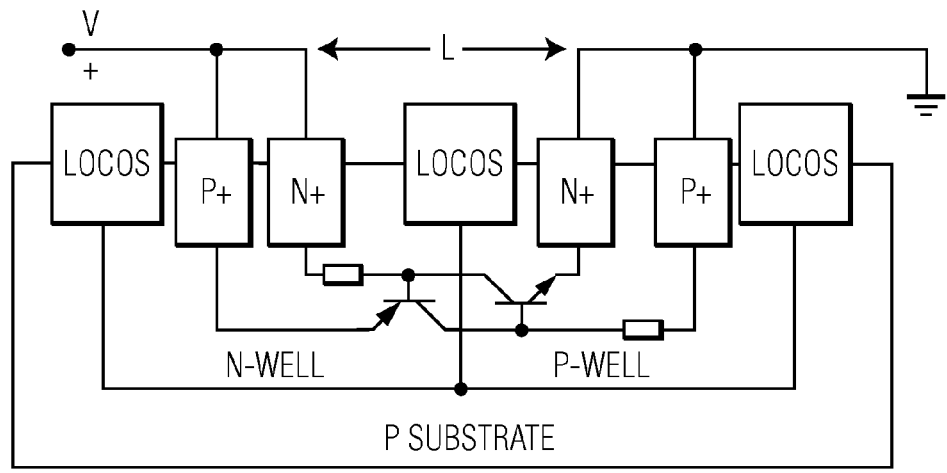
FIG. 1 is a schematic of a known lateral ESD device.
Figure 2A:
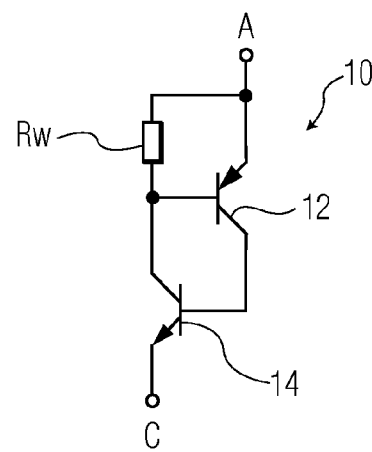
FIG. 2a is an equivalent circuit of an ESD device

The equivalent of circuit of the ESD protection device 10 is shown in FIG. 2a. In overview the ESD protection device 10 may comprise an anode terminal A and a cathode terminal C. The ESD protection device 10 may effectively be regarded as a PNP transistor 12 connected to an NPN transistor 14. In this way the ESD protection device 10 may be regarded as a silicon controlled rectifier (SCR).

Typically in an known SCR device arrangements all regions are connected externally. A base terminal and an emitter terminal of the PNP transistor 12, and a collector terminal of the NPN transistor may be short circuited by the anode terminal A of the ESD protection device 10.

In addition, a collector terminal of the NPN transistor 14 may be connected to the base terminal of the PNP transistor 12. The emitter terminal of the NPN transistor may form the cathode terminal C of the ESD protection device 10. $R_w$ may represent the spreading resistance of the collector of the PNP transistor 12 which may be formed by an n-type layer, known as an n-well, as discussed below. Typically, in use the anode terminal A may be connected to the I/O line or device to be protected and the cathode terminal C will be connected to ground as discussed in more detail below. For example in the case of HDMI or USB protection, the ESD protection device 10 may be used as a bypass path to ground on the data lines. When an ESD event occurs, the ESD protection device 10 will turn on and the current is shunted to ground.

Figure 2B:
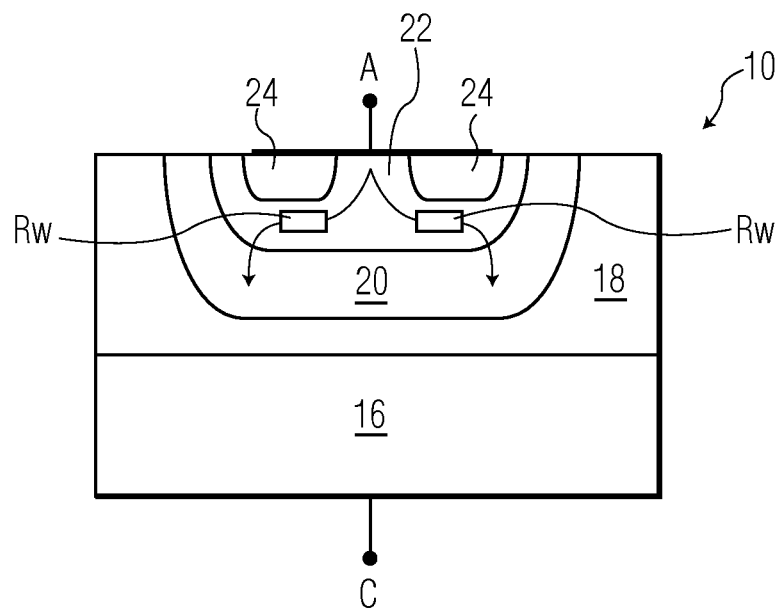
FIG. 2b is a schematic cross-section of an ESD device arranged as a vertical device.

Referring now to FIG. 2b for example, the general structural arrangement of the ESD protection device 10 will be described. In overview, the ESD protection device 10 may be regarded as four vertically arranged p-n-p-n layers to form a vertically arranged SCR made up of a PNP transistor 12 and a NPN transistor 14. In this regard certain layers of the vertically arranged p-n-p-n layers may be shared between the PNP and NPN transistors.

The cathode terminal C of the ESD protection device 10, which may effectively be the emitter terminal of the NPN transistor 14, is formed by an appropriate ohmic contact to a substrate 16 and an epitaxial (or epi) overlayer 18 provided on the substrate 16. The substrate may be a heavily doped N+ silicon substrate and the overlayer 18 may be a lightly doped N-type epitaxial overlayer. The epitaxial overlayer 18 may be intrinsically or lightly doped, thereby minimising device capacitance. The epitaxial overlayer 18 may be required to prevent implantation into the heavily doped substrate. Implanting into the substrate may cause the junction capacitance to be too high. Since the overlayer 18 is lightly doped this may results in a wide depletion region and low junction capacitance.

A p-type layer 20 may form the base of the NPN transistor 14. The p-type layer 20 may be shared with the collector of the PNP transistor 12. The p-type layer may be formed in the N-type epitaxial overlayer 18 by deep implantation, for example an implantation step followed by a diffusion step. The p-type layer 20 may be formed as a p-well in the epitaxial overlayer 18. An n-type layer 22 may form the collector of the NPN transistor 14. The n-type layer 22 may be shared with the base of the PNP transistor 12 and may be formed as n-well in the p-well layer 20. The n-type layer 22 may be formed by shallow implantation and diffusion into the p-type layer 20.

A further p-type layer 24 may form the emitter of the PNP transistor 12. The p-type layer 24 may be formed by shallow implantation and diffusion into the n-type layer 22. As discussed above in relation to FIG. 2a both the base, formed by n-type layer 22, and an emitter, may be formed by p-type layer 24 of the PNP transistor 12, may be short circuited, that is connected by the same contact, in this case by the anode terminal A of the ESD protection device 10. The anode terminal A may be any appropriate ohmic contact.

Figure 3A:
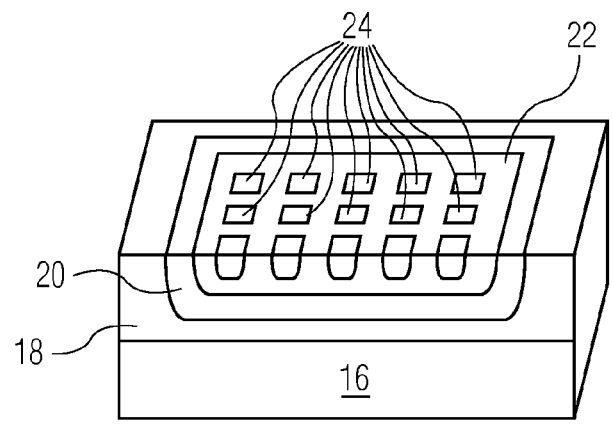
FIG. 3a illustrates a meshed emitter arrangement for the ESD device of FIG. 2b.
Figure 3B:
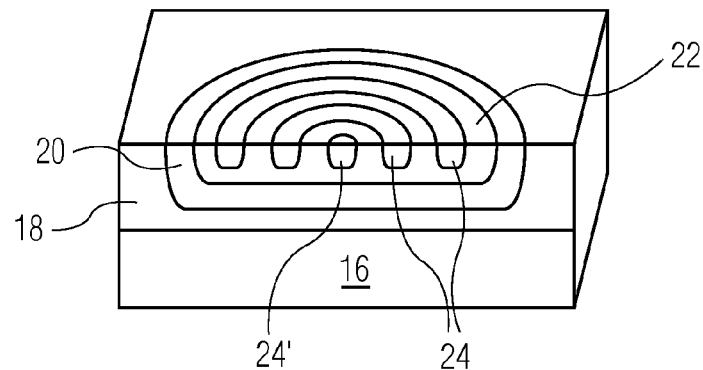
FIG. 3b illustrates a ring emitter arrangement for the ESD device of FIG. 2b.
Figure 3C:
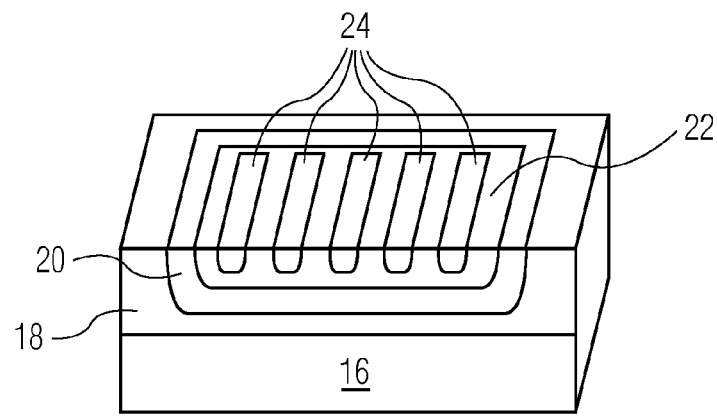
FIG. 3c illustrates a finger emitter arrangement for the ESD device of FIG. 2b.

FIGS. 3a, 3b and 3c show various examples of anode arrangements. As with the arrangement described above in relation to FIG. 2b the general structure may be the same and this may be seen by comparing the structures of each of FIGS. 3a, 3b and 3c with the general structure of FIG. 2b. It may be seen they are broadly similar from the substrate 18 up to the n-well layer 22. The general difference in each case of FIGS. 3a, 3b and 3c being the arrangement of anodes.

Specifically, with reference to FIG. 3a a plurality of the further p-type layers 24 may arranged as a mesh in a regular n×m array, whereby n is the number of rows and m is the number of columns in the array, to form the emitter of the PNP transistor 12. The array of further p-type layers 24 may arranged evenly in the n-type layer 22 forming the base of the PNP transistor 12.

As with the arrangement of FIG. 2b, the anode terminal A (not illustrated here) which may be any appropriate ohmic contact. The anode terminal may be arranged such that it short circuits the plurality of the further p-type layers 24 forming the emitter and also the n-type layer 22 forming the base of the PNP transistor 12 of the ESD protection device. In the arrangement of FIG. 3a the n×m array is 3×5 array. However, the skilled person will understand that any number of positive integer value rows or columns may be used as required by the specific application.

In the example shown in FIG. 3c, the array may be a 1×4 array. For this arrangement it is possible to tailor the spreading resistance $R_w$ in accordance with a specific application. In the examples of FIGS. 3a and 3c the further p-type layers 24 may be substantially rectangular cuboid.

With reference to FIG. 3b, the plurality of the further p-type layers 24 may be arranged as a series of concentric rings around a central p-type layer 24'. As with the arrangement of FIGS. 2b, 3a and 3c, the anode terminal A (not illustrated here) may be any appropriate ohmic contact and may be arranged such that it may short circuit the plurality of the further p-type layers 24 and central p-type 24' layer forming emitter, and the n-type layer 22 forming the base of the PNP transistor 12 of the ESD protection device 10. Typically, the p-type layer 20, forming the base of the NPN transistor 14 and the collector of the PNP transistor 12, may have a radius of around 42 µm. The N-well, or the n-type layer 22 forming the base of the PNP transistor 12, may have a radius of 35 µm. The further p-type layers 24 may each have a width of 3 µm, where the distance between each of the further p-type layers 24 may be 3 µm. The distance between the central p-type layer 24' and the next adjacent p-type layer 24 may be 3 µm. The skilled person will understand that the dimensions presented here are given merely as an example to illustrate the general arrangement of the layers.

Each of the further p-type layers 24, 24' arrangements of FIGS. 3a, 3b and 3c may be such that the spreading resistance $R_w$ of the n-type layer 22 forming the base of the PNP transistor 12 (that is the N-well resistance of the PNP transistor) is chosen such that $R_w$ is adapted to the relevant application. The depth of the further p-type layers determines the spreading resistance $R_w$.

Figure 4A:
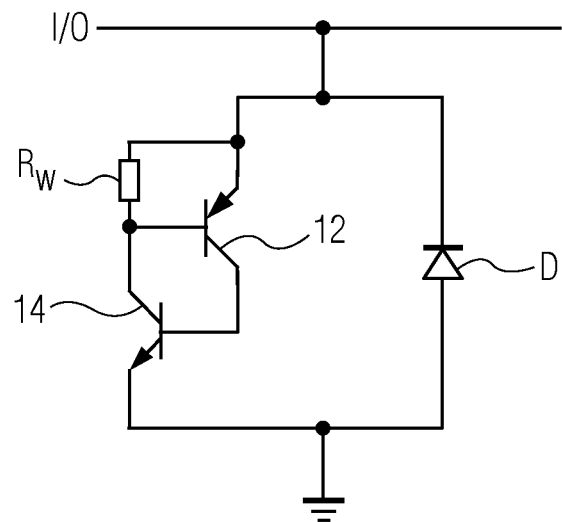
FIG. 4a is an equivalent circuit of an ESD device and parallel diode.

As an alternative to the anode arrangements described, the doping of the n-type layer 22 forming the base of the PNP transistor 12 may be increased. The ESD protection device 10 may be may be used as an ESD protection device having a low clamping voltage. As mentioned above, the anode A of the ESD protection device 10 may be connected to an I/O line of a high data rate connection and the cathode C of the ESD protection device is connected to ground as illustrated in FIG. 4a.

In the event of a positive ESD event, the ESD protection device 10 will be triggered and the ESD current will be shunted through the ESD protection device. The specifics of how the ESD protection device is triggered will be discussed in more detail below. For negative ESD events an additional current path may be required. In this case, as illustrated in FIG. 4a, a diode D may be connected in parallel across the ESD protection device 10. A cathode of the diode D is connected to an anode of the ESD protection device 10 and a cathode C of the ESD protection device is connected to an anode of the diode D. In the way the diode may be considered to be connected in the forward direction to the ESD protection device 10.

The diode D may be a discrete component separate from but connected to the ESD protection device 10. Alternatively, the diode may be monolithically integrated with the ESD protection device. In this regard monolithic integration may be considered as two devices, in this example the diode D and the ESD protection device 10 sharing the same substrate 16.

Figure 4B:
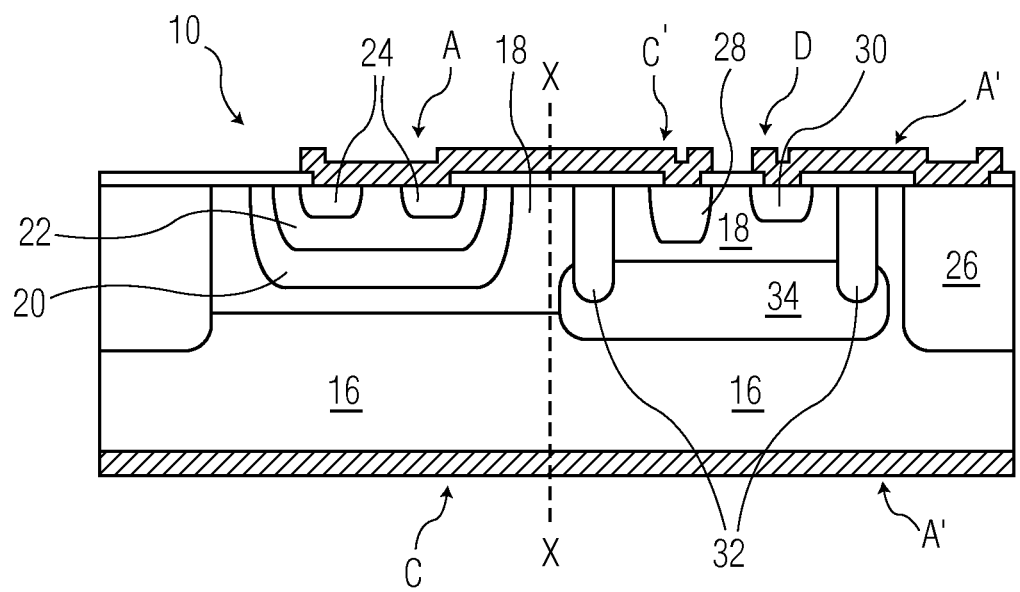
FIG. 4b is a schematic cross-section of an ESD device and parallel diode.

An arrangement for integrating a forward connected parallel diode D with the vertical type ESD protection device 10 as discussed above is illustrated in FIG. 4b. Comparing FIG. 2a (or FIG. 5a or FIG. 5b) with FIG. 4b, like reference numerals correspond to like features. The ESD protection device 10, is integrated with a diode D. As illustrated in FIG. 4b line X-X notionally divides the ESD protection device 10 from the diode D. Both the diode D and the ESD protection device 10 are formed on the substrate 16. As mentioned above, the ESD protection device 10 is a vertical device, however in this example the diode D is a lateral type device.

Following the circuit diagram of FIG. 4a, the anode A of the ESD protection device 10 is connected to the cathode C' of the diode D. This connection may be achieved by using an appropriate metal contact such that the anode A and the cathode C' are a common contact to both the ESD protection device 10 and the diode D. The anode A' of the diode D is connected to the cathode C of the ESD protection device 10 by way of a metallic contact and a low ohmic connection 26, for example an deep N+ diffusion layer, to the substrate 16. The low ohmic connection may be a deep N-type diffusion region.

This arrangement ensures that whilst a lateral diode D has been used as a shunt for a reverse ESD current, the ESD protection device retains a vertical structure by having top and bottom anode A and cathode C terminals respectively, that connect to the respective anodes and cathodes of the ESD protection device 10 and diode D as illustrated schematically in FIG. 4a.

With reference again to FIG. 4b, it can be seen that the anode A of the ESD protection device 10 and the cathode of the diode D may be formed as a single contact. The contact may be formed of any appropriate metal, or combination of metals as understood by those skilled in the art. The cathode C' of the diode connects to an appropriate N-type 28 layer, for example an N+ layer and the anode A' of the diode is connected to an appropriate P-type layer 30, for example a heavily doped P+ layer. The respective N-type 28 and P-type 30 layers form the p-n junction of the diode D. As with the ESD protection device, a lightly doped epitaxial overlayer 18 may be provided to reduce the junction capacitance of the lateral diode D. Isolation layers are required to electrically isolate the ESD protection device 10 from the diode D, more specifically n-type layer 28 is isolated from the substrate 16.

Isolation may be achieved by appropriate isolation layers 32, 34. In this regard trench isolation layer 32, may be combined with a deep implant region 34 to create the required isolation. The isolation layer may be of the same conductivity type, in this example a heavily doped P+ region. The isolation layer may further serve to isolate the diode D from the substrate 16 and the low ohmic region 26, and thus avoid a short circuit of the diode to the cathode C.

Figure 8:
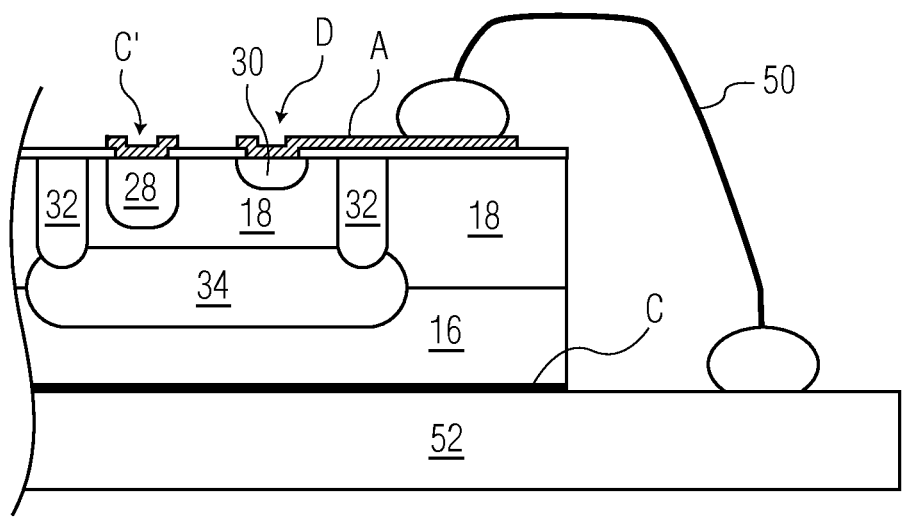
FIG. 8 illustrates a wire bond connection arrangement for an ESD device.
Figure 10:
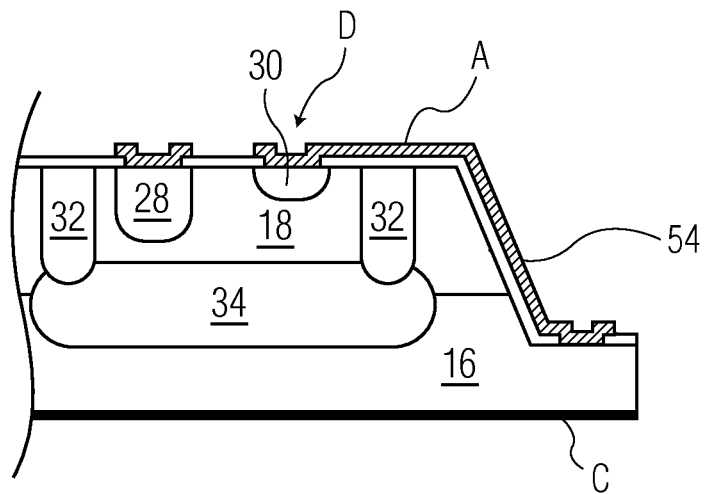
FIG. 10 illustrates an n-doped poly-silicon trench connection for and ESD device.

Alternative arrangements to the low ohmic connection for example an deep N+ diffusion layer 26 may be used to make the connection of the anode A of the ESD protection device 10 to the cathode C' of the diode D. FIG. 8 illustrates a wire bond 50 arrangement to a leadframe 52 onto which the cathode C of the ESD protection device 10 is connected. Similarly, as shown in FIG. 10 an appropriate metal contact 54 or track may be formed on one edge of the ESD protection device 10 down to the substrate 16. In this example the edge profile the ESD protection device is a mesa structure, although any appropriate edge profile may be used.

Figure 9:
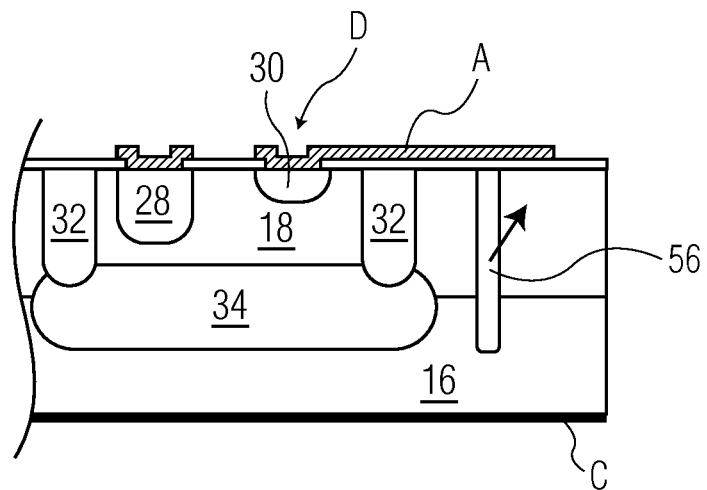
FIG. 9 illustrates a front interconnect structure metal on a mesa ESD device.
Figure 11:
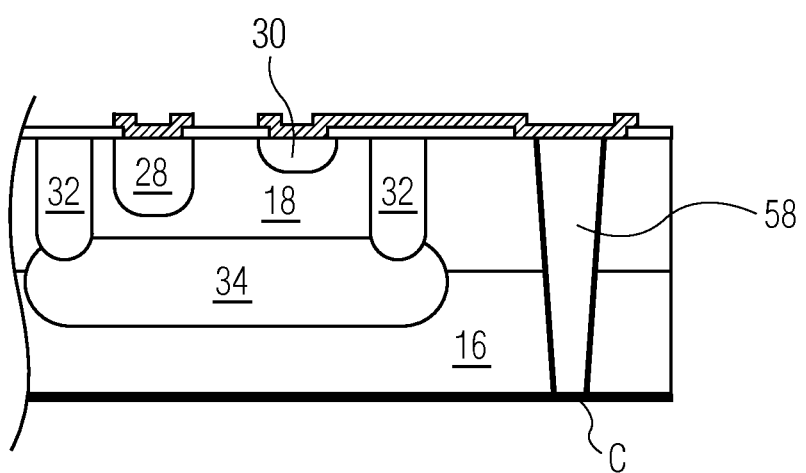
FIG. 11 illustrates a through silicon via connection for and ESD device.

In the example of FIG. 9, the connection may be made using an n-type doped poly-silicon filled trench 56 connecting the substrate 16. Similarly, a through silicon via arrangement 58 may be used as illustrated in FIG. 11.

Figure 5A:
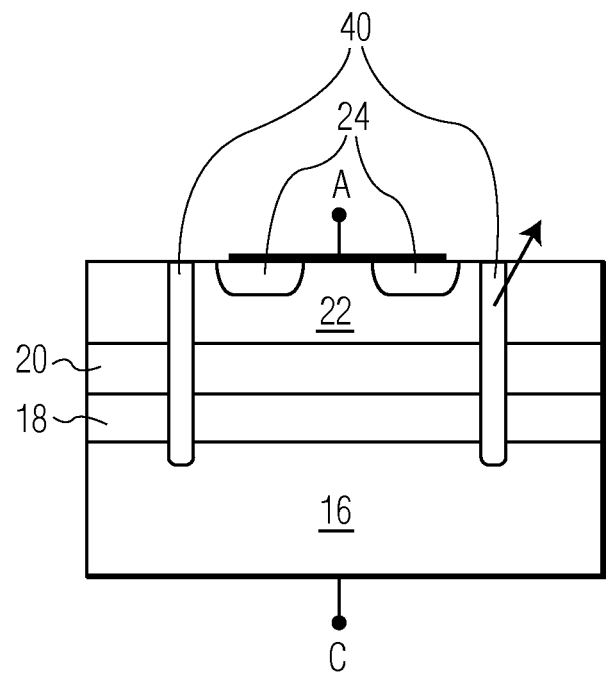
FIG. 5a illustrates an ESD device with side wall trench isolation.
Figure 5B:
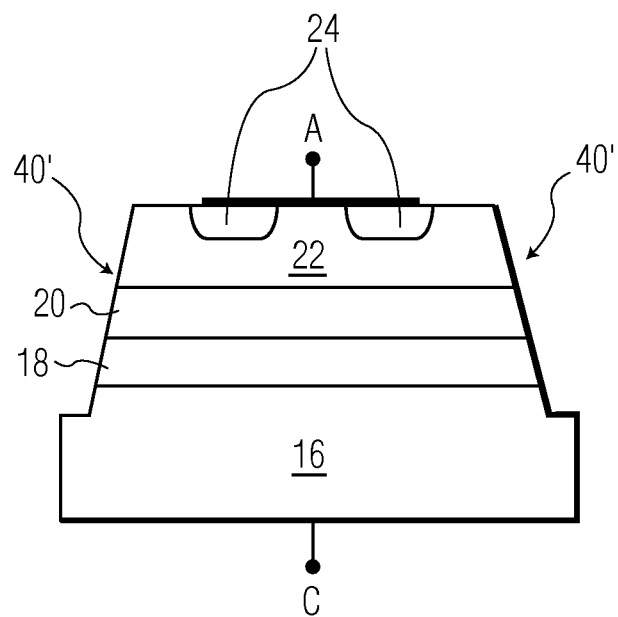
FIG. 5b illustrates an ESD device with side wall mesa structure isolation.

The arrangements of FIGS. 5a and 5b are configured so as to cooperate with the integrated diode D. As illustrated in FIG. 5a, the ESD protection device 10 may also include additional vertical trenches 40 arranged at either edge of the device 10. The vertical trenches may extend vertically from the top of the device through the entire depth of the n-type layer 22 forming the base of the PNP transistor 12, through the entire depth of the p-type layer 20, forming the base of the NPN transistor 14 and the collector of the PNP transistor 12, through the entire depth the overlayer 18 and partially into the substrate 16. The vertical trenches may be filled with a suitable insulating material such as silicon dioxide, $SiO_2$. The purpose of the trenches is isolate the ESD protection device 10 from the edge of the device die and the integrated lateral diode D to reduce or eliminate further parasitic capacitance effects in the ESD protection device 10 by reducing or eliminating so-called junction side wall capacitance and limiting the breakdown or clamping voltage of the device would which may be too high in case of negative ESD stress.

As an alternative to the arrangement of FIG. 5b, the junction side wall capacitance may be eliminated by employing a mesa type structure 40' or the ESD protection device 10. In providing such a structure, the ESD protection device is isolated from the sawing lane by the insulating layer on the mesa sidewall (not shown in the picture). In the case of FIG. 5b free space terminates the sawing lane.

As discussed above, the arrangement of n-type layer 22 forming the base of the PNP transistor 12 and further p-type layers 24, making up the anode region of the ESD protection device may ensure that the ESD protection device 10 does not trigger until an ESD event occurs. The triggering current of the ESD protection device may be in the range 900 mA to 1000 mA.

Each of the arrangements described above may typically result in reduced device capacitance. Specifically, it may be reduced junction capacitance thus making the ESD protection device 10 suitable for ESD protection on high data rate lines, such as for example HDMI, USB 3.0 or other high data rate applications. As a result of the low device capacitance the ESD protection device 10 may also be suitable for protecting antenna from ESD events.

In operation the ESD protection device operates as an SCR in the forward direction. This is due to the fact that the base of the PNP transistor 12 is floating.

In operation, and as mentioned briefly above, the ESD protection 10 device may protect an I/O line by connecting the anode A to the I/O line and the cathode C to ground. If a positive ESD current occurs on the I/O line, the ESD protection device will be triggered (with reference to FIG. 6) as follows.

Once the base collector junction of the NPN transistor 12 breaks down a current flows via $R_w$ and then over a base-emitter junction of the PNP transistor 14 which is forward biased. If the current is sufficiently high the base emitter junction of PNP transistor 12 is forward biased and the PNP transistor is turned on. In the end both transistors are turned on since each of them supplies the other transistor with the necessary base current.

Since the ESD protection device 10 may be regarded as an SCR, when a positive ESD event occurs (that is a positive voltage is applied between the anode A and the cathode C), the ESD protection device 10 may initially, that is at currents lower than the currents need to trigger the SCR behaviour, behave like an NPN transistor, such that no current will flow due to the emitter-base junction being reversed biased. This is known as reverse blocking mode. When the voltage ESD voltage, that is the applied voltage between the anode A and cathode C reaches the emitter-collector breakdown voltage of the NPN, typically a few volts higher than the operation voltage of the application the ESD current may then flow from the anode A through the n-type layer (or n-well) 22 to the cathode C of the ESD protection device 10 where the NPN transistor 14 turns on. As mentioned above the n-well has an associated resistance $R_w$ represents the spreading resistance of the collector of the NPN transistor 14 and the base of the PNP transistor 12. As the ESD current further increases the voltage drop across the n-well resistance $R_w$ becomes large enough to forward bias the emitter-base junction of the PNP transistor 12.

Figure 2C:
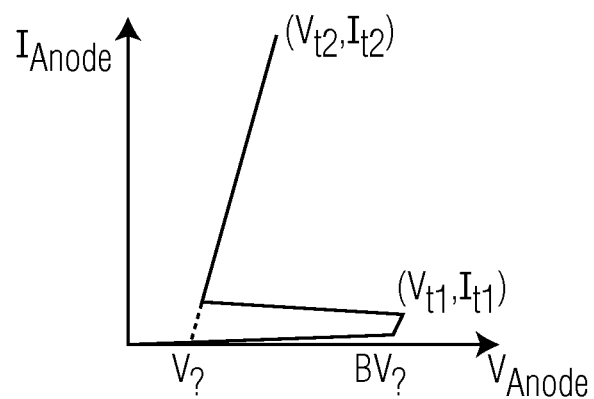
FIG. 2c is an IV characteristic of the vertical ESD device of FIG. 2b.

Once both the PNP and the NPN are turned on, the regenerative process, namely the collector current of one transistor is the base current of the other and vice versa, starts to trigger the SCR, which finally leads the ESD protection device 10 to enter the low voltage on-state as illustrated by FIG. 2c.

Under reverse-bias the behaviour of the SCR is determined by the open-base NPN transistor 12.

Figure 6:
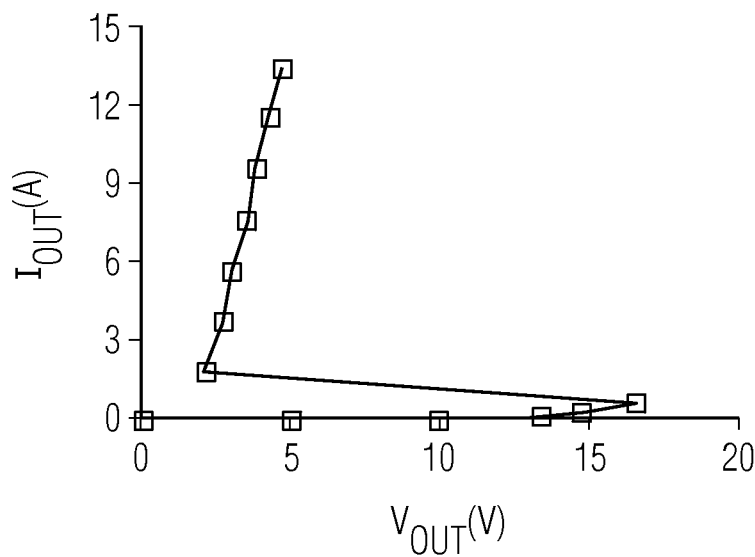
FIG. 6 shows a simulated transient line pulse IV characteristic of an ESD device.

With reference to FIG. 6, the simulated quasi-static IV at 100 ns transmission line pulse was observed for a ESD protection device 10 Under these simulation conditions, the ESD protection device turned on at approximately 10V, following which the voltage rises, as the current rises, to approximately 1 A. Here the current is seen to flow through the n-well region 22 and almost no, or very little current, flows through the P+ region. For a current above 1 A the snapback may be observed where the voltage across the anode A and cathode C of the ESD protection device drops rapidly to approximately 2 V. At this point the PNP transistor 12 of the ESD protection device 10 turns on and the ESD current predominantly flows through the p-type layers 24.

As a result of the snap-back observed in the IV curve of FIG. 6, the clamping voltage of the device is improved compared to open base transistors or diodes. For a current of 12 A the clamping voltage is approximately 4 V.

Figure 7:
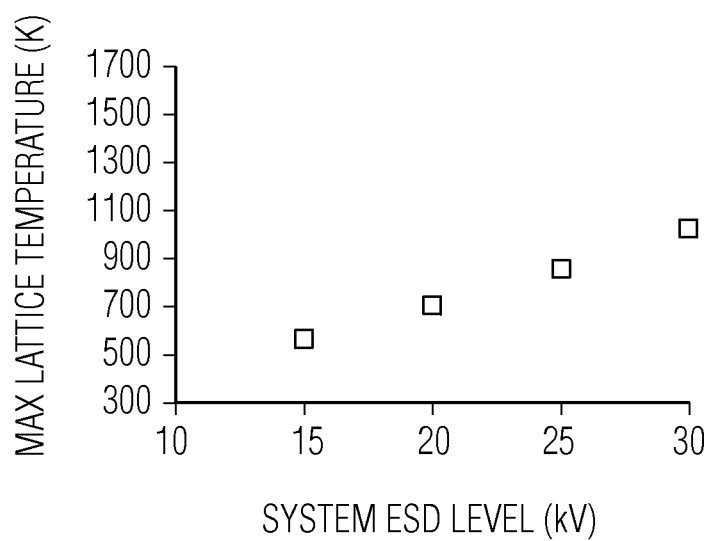
FIG. 7 shows the simulated maximum lattice temperature for various system level ESD pulses.

The ESD robustness of the ESD protection device 10 may be observed in FIG. 7. FIG. 7 is a transient electro-thermal simulation where system level ESD pulses were applied and simulated maximum local lattice temperatures (or maximum crystal temperature in the device) during the system level pulse were observed. It can be seen that the maximum lattice temperature inside the device even during a 30 kV system level pulse is approximately 1024 K, which is still far below the melting temperature of the for example silicon material which may be used to fabricate the ESD protection device. Taking silicon as an example the ESD robustness of the device may therefore be above 30 kV, whilst the device capacitance between 0.5 and 0.6 pf.

Known SCRs are only applied in lateral situation such as in ICs which are only able to survive 2 kV human body model pulses.

Due to the vertical arrangement of the device it may be used in standard package types where contact to the back-side of the ESD protection device is required allowing it to be used in standard small signal package types.

Figure 12:
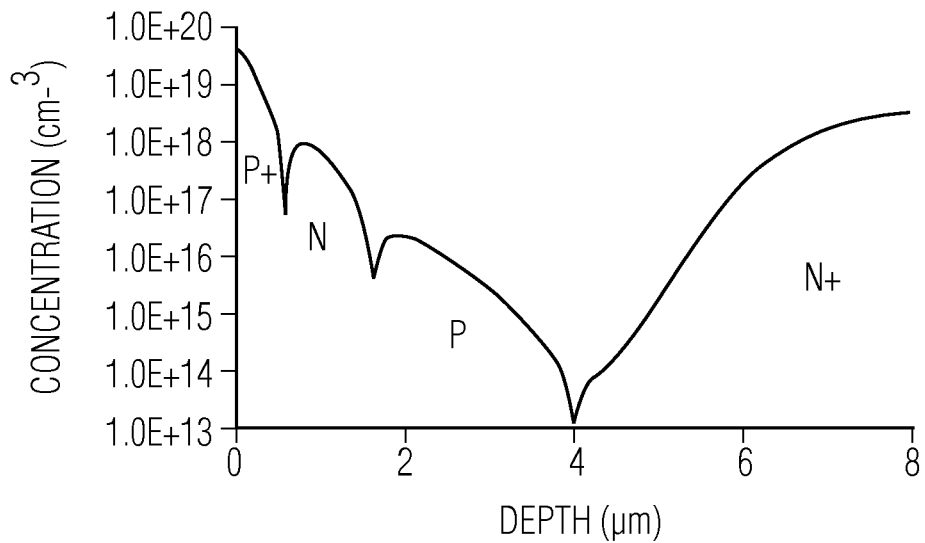
FIG. 12 shows a doping profile for an ESD device.

FIG. 12 shows the doping profile of the ESD protection device.

Figure 13:
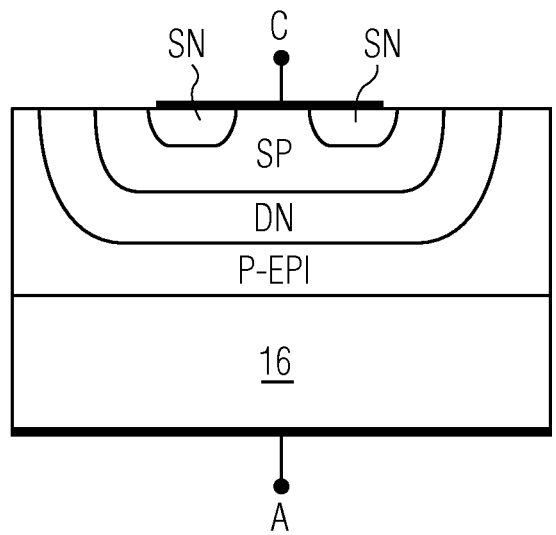
FIG. 13 illustrates an alternative arrangement for an ESD device

Whilst the above discussion relates to the ESD protection device formed on an n-type substrate, based on the above discussion, the skilled person will now understand that it is also possible realise the ESD protection device on a p-type substrate 16' as illustrated in FIG. 13. For such an arrangement, the conductivity type of the doping regions discussed above would be reversed. One advantage of this arrangement is that the anode will be on the backside of the device, such that a monolithic multichannel data line protection can be realised.

Figure 14A:
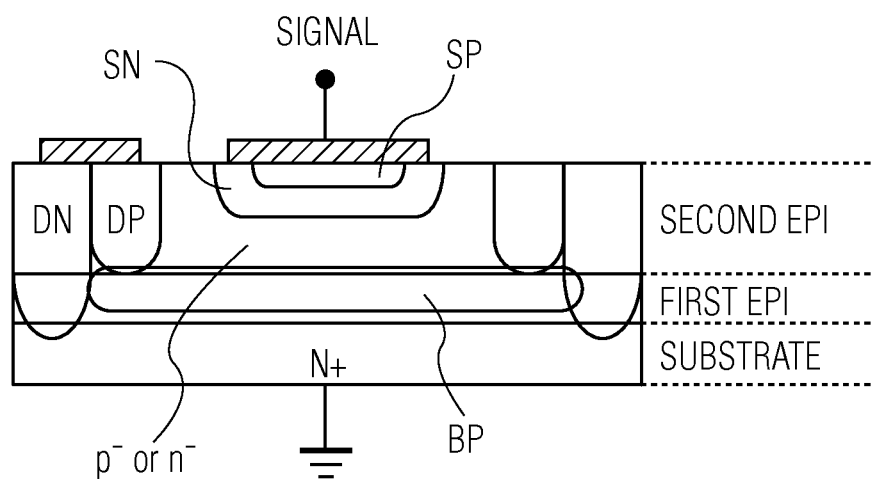
FIG. 14a illustrates an alternative arrangement for an ESD device
Figure 14B:
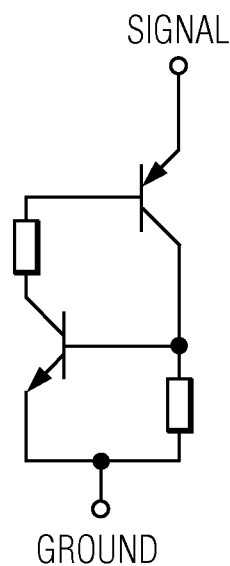
FIG. 14b is an equivalent circuit of an ESD device
Figure 14C:
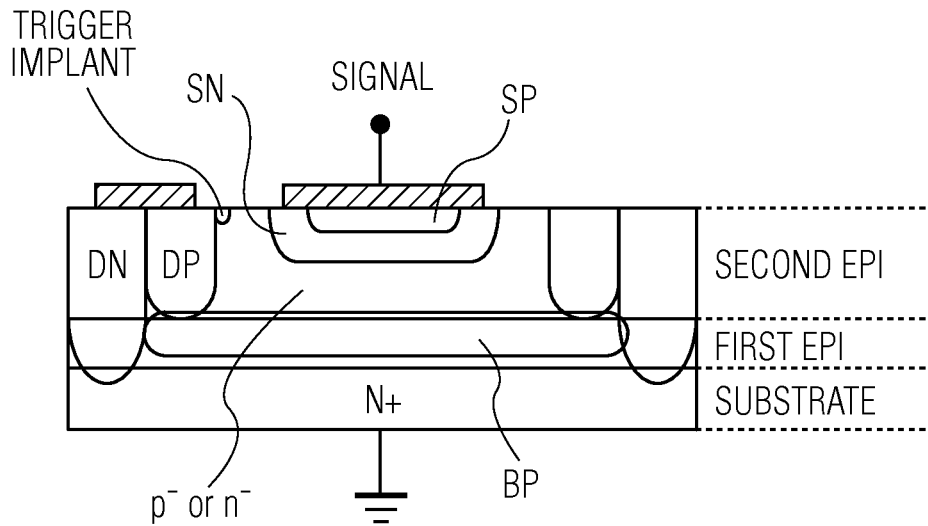
FIG. 14c illustrates an alternative arrangement for an ESD device
Figure 14D:
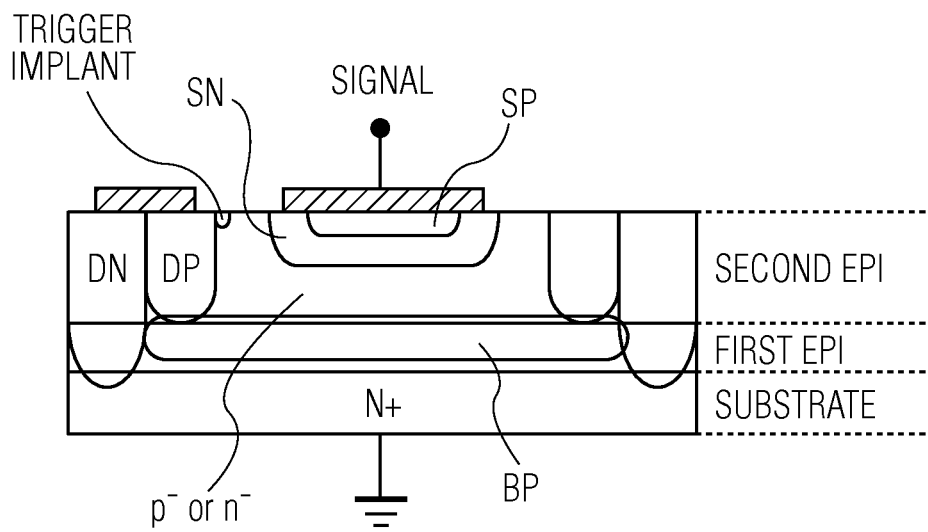
FIG. 14d illustrates an alternative arrangement for an ESD device

Referring now to FIG. 14a an alternative ESD protection arrangement, to that presented above will be discussed. The main differences between the alternative arrangement and those presented above are the metallic (ohmic connection between DN and DP) and the trigger implant such that there are no floating terminals.

The trigger implant is included so that the trigger voltage is sufficiently low (5-10V). Without trigger implant the device would conduct current at about 50-100V.

The DN is again the low ohmic connection from surface to substrate. The DP serves as an isolation layer so that the electric field from SN does not touch DN. This would give a poor electrical behaviour (very round IV curves, high leakage currents). The diode in this arrangement is formed by the layers SN to DP.

Figure 15:
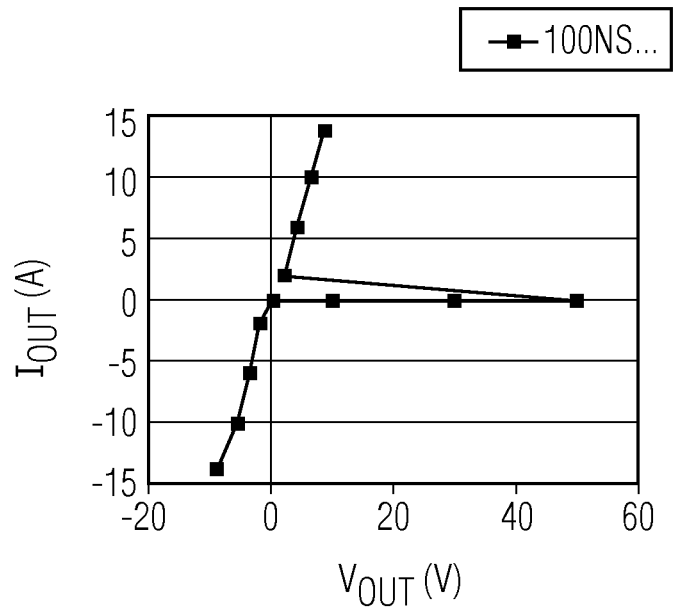
FIG. 15 shows a simulated transient line pulse IV characteristic of an ESD device.

With reference to FIG. 15, the simulated quasi-static IV curve for 100 ns transmission line pulses (TLP) was observed. Under these simulation conditions, the ESD protection device 10 turned on at approximately 10V, following which the voltage rises, as the current rises, to approximately 1 A. Here the current is seen to flow through the n-well region 22 and almost no, or very little current, flows through the P+ region. For a current above 1 A the snapback may be observed where the voltage across the anode A and cathode C of the ESD protection device drops rapidly to approximately 2 V. At this point the PNP transistor 12 of the ESD protection device 10 turns on and the ESD current predominantly flows through the p-type layers 24.

As a result of the snap-back observed in the IV curve of FIG. 15, the clamping voltage of the device is improved over known SCRs. For a current of 12 A which means that the device survives 8 kV system level pulse, the clamping voltage is approximately 9 V.

The capacitance of the vertical SCR can be further reduced by the following arrangements. Using a p-type epitaxial layer for capacitance reduction and integration of additional signal lines on the device. In which case the capacitance would come from SN to p-type epitaxial layer where this area is smaller than the area formed by DP, BP and n-type epitaxial layer.

Figure 16:
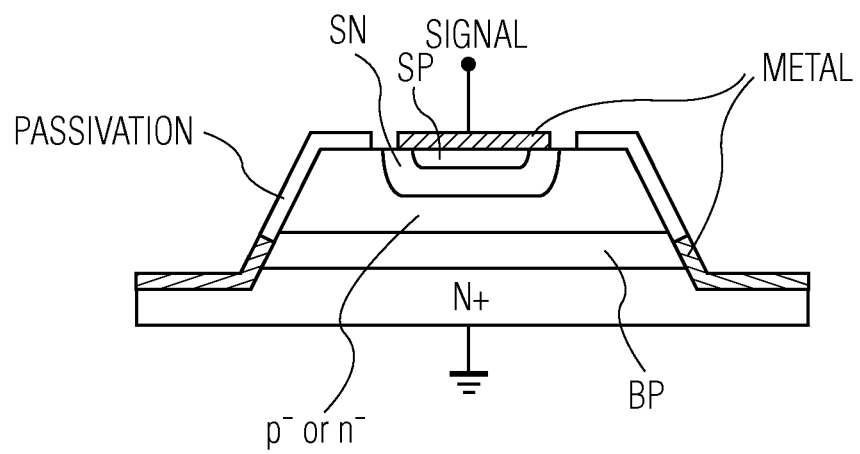
FIG. 16 illustrates an ESD device with side wall mesa structure isolation.

The mesa structure as shown in FIG. 16 can also be used to eliminate the junction sidewall capacitance on n-type epitaxial layer. Sidewall capacitance is capacitance coming from the vertical part of the diffusion regions. If a diffusion region is diffused 4 μm deep additional capacitance would result at the side of the region as well as at its bottom. As typically no current flows at the side, only at the bottom they are unwanted. They are creating only parasitic capacitances and have no use.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A semiconductor ESD protection device comprising a vertical arrangement of alternating conductivity type layers, wherein the layers are arranged as a silicon controlled rectifier and wherein the silicon controlled rectifier is arranged as a vertical device and having top and bottom opposing contacts, wherein the alternating conductivity type layers comprise a first p-type layer, a first n-type layer that surrounds the first p-type layer, a second p-type layer that surrounds the first n-type layer, an N-type epitaxial layer that surrounds the second p-type layer and an N-type silicon substrate underneath the N-type epitaxial layer.

2. The semiconductor ESD protection device of claim 1, wherein the vertically arranged silicon controlled rectifier is made up of a first and a second transistor.

3. The semiconductor ESD protection device of claim 2, wherein the first transistor is of opposite conductivity type to the second transistor.

4. The semiconductor ESD protection device of claim 3 wherein the first transistor is a PNP transistor and the second transistor is a NPN transistor.

5. The semiconductor ESD protection device of claim 3 wherein the first transistor is a NPN transistor and the second transistor is a PNP transistor.

6. The semiconductor ESD protection device of claim 4, wherein a base terminal of the NPN transistor is floating.

7. The semiconductor ESD protection device of claim 5, wherein a base terminal of the PNP transistor is floating.

8. The semiconductor ESD protection device of claim 2, wherein the top contact is arranged such that it short circuits an emitter terminal and a base terminal of the first transistor.

9. The semiconductor ESD protection device of claim 1 further comprising a lateral type diode integrated with the vertically arranged silicon control rectifier, wherein the lateral type diode and vertically arranged silicon control rectifier share a common substrate.

10. The semiconductor ESD protection device of claim 9 wherein a low ohmic contact is arranged to connect an anode terminal of the lateral type diode to a cathode terminal of the silicon control rectifier.

11. The semiconductor ESD protection device of claim 10, further comprising a plurality of isolation layers arranged to electrically isolate the lateral type diode from the silicon control rectifier.

12. The semiconductor ESD protection device of claim 11 wherein the isolation layers are trench isolation layers and a deep implant region.

13. The semiconductor ESD protection device of claim 1, where the vertically arranged silicon control rectifier further comprises a trigger implant.

14. The semiconductor ESD protection device of claim 2, wherein the trigger implant is provided in a base region of the first transistor and collector region of the second transistor.

15. A high speed data transfer line comprising the semiconductor device of claim 1.

16. A semiconductor ESD protection device comprising a vertical arrangement of alternating conductivity type layers, wherein the layers are arranged as a silicon controlled rectifier and wherein the silicon controlled rectifier is arranged as a vertical device and having top and bottom opposing contacts, wherein the semiconductor ESD protection device further comprises:

a lateral type diode integrated with the vertically arranged silicon control rectifier;

a plurality of isolation layers arranged to electrically isolate the lateral type diode from the silicon control rectifier; and a metal contact or track formed on one edge of the semiconductor ESD protection device, wherein the metal contact or track continuously covers a P-type layer, an N-type epitaxial layer, one of the isolation layers, and a n-type substrate, wherein the lateral type diode and vertically arranged silicon control rectifier share a common substrate.

* * * * *